United States Patent
Müller

(10) Patent No.: US 9,577,356 B2
(45) Date of Patent: Feb. 21, 2017

(54) ELECTRIC CONTACTING FOR A CIRCUIT PLATE TO A CONDUCTOR

(71) Applicant: ZF Friedrichshafen AG, Friedrichshafen (DE)

(72) Inventor: Karl-Heinz Müller, Auerbach (DE)

(73) Assignee: ZF FRIEDRICHSHAFEN AG, Friedrichshafen (DE)

( * ) Notice: Subject to any disclaimer, the term of this patent is extended or adjusted under 35 U.S.C. 154(b) by 0 days.

(21) Appl. No.: 15/051,837

(22) Filed: Feb. 24, 2016

(65) Prior Publication Data
US 2016/0261066 A1    Sep. 8, 2016

(30) Foreign Application Priority Data

Mar. 6, 2015  (DE) .................. 10 2015 204 119

(51) Int. Cl.

| H01R 4/30 | (2006.01) |
|---|---|
| H01R 12/58 | (2011.01) |
| H05K 3/36 | (2006.01) |
| H01R 13/74 | (2006.01) |
| H01R 4/56 | (2006.01) |
| F16B 37/04 | (2006.01) |
| H01R 4/34 | (2006.01) |
| H01R 4/60 | (2006.01) |

(52) U.S. Cl.
CPC ............. *H01R 12/58* (2013.01); *F16B 37/043* (2013.01); *H01R 4/30* (2013.01); *H01R 4/34* (2013.01); *H01R 4/56* (2013.01); *H01R 4/60* (2013.01); *H01R 13/748* (2013.01); *H05K 3/368* (2013.01)

(58) Field of Classification Search
None
See application file for complete search history.

(56) References Cited

U.S. PATENT DOCUMENTS

| 1,469,665 | A | * | 10/1923 | Pleister | ................. | F16B 13/066 |
|---|---|---|---|---|---|---|
| | | | | | | 411/24 |
| 2,381,113 | A | * | 8/1945 | Cook | .................. | F16B 19/1054 |
| | | | | | | 411/53 |
| 4,570,338 | A | * | 2/1986 | Ignatowicz | ............ | H05K 3/308 |
| | | | | | | 29/843 |
| 5,161,916 | A | * | 11/1992 | White | ................... | E21D 21/008 |
| | | | | | | 405/259.4 |
| 5,655,931 | A | * | 8/1997 | Perugini | .............. | H01R 12/526 |
| | | | | | | 439/573 |
| 6,293,743 | B1 | * | 9/2001 | Ernst | ..................... | F16B 13/066 |
| | | | | | | 411/24 |
| 6,609,914 | B2 | * | 8/2003 | Dibene, II | ................ | G06F 1/18 |
| | | | | | | 257/E23.088 |
| 6,884,091 | B1 | * | 4/2005 | Rigby | .................... | H01R 9/091 |
| | | | | | | 439/737 |
| 7,028,389 | B2 | * | 4/2006 | Chang | .................... | H05K 7/142 |
| | | | | | | 174/363 |

* cited by examiner

*Primary Examiner* — Tho D Ta

(74) *Attorney, Agent, or Firm* — Brinks Gilson & Lione

(57) ABSTRACT

Electricity bolt for electrical contact of a printed circuit board with an electric conductor, with a basic body, wherein the basic body can be electrically contacted by a first section with the printed circuit board, and by a second section with the electric conductor, wherein the basic body at least in the area of the first section, by which the basic body is electrically conductively contactable with the printed circuit board, is designed as a hollow component, into which for the electrical contact with the printed circuit board a screw is so screwed that the first section is radially outwardly expandable by the screw.

19 Claims, 2 Drawing Sheets

ELECTRIC CONTACTING FOR A CIRCUIT PLATE TO A CONDUCTOR

RELATED APPLICATIONS

This application claims the priority of German Patent Application DE 10 2015 204 119.0, filed Mar. 6, 2015, which is incorporated by reference herein in its entirety.

BACKGROUND

1. Technical Field

The invention relates to an electricity bolt for electrical contacting of a printed circuit board with an electric conductor.

2. Background Information

Electricity bolts are used for making electrical contact of a printed circuit board, namely a trace of the printed circuit board, with an electric conductor, for example, an electric conductor designed as a busbar. Such electricity bolts have a basic body, wherein by a first section the basic body can be electrically contacted with the printed circuit board and by a second section with the electric conductor.

Electricity bolts known from practice have in the first section of the basic body, by which the electricity bolt is to be contacted with the printed circuit board, an outer diameter which is slightly larger than an inner diameter of a recess in the printed circuit board, so that the first section of the basic body of the electricity bolt is mounted by a press fit in the recess of the printed circuit board. In this way, chips can be scraped from the printed circuit board, which can cause short circuits.

Other electricity bolt known from practice are soldered on their first section to the printed circuit board, but the soldering of the electricity bolt to a printed circuit board is costly.

BRIEF SUMMARY OF THE INVENTION

On this basis, the object of the present invention is to provide a novel electricity bolt for electrical contacting of a printed circuit board with an electric conductor. This object is achieved by an electricity bolt according to claim 1. According to the invention, at least in the area of the first section, through which it is to be electrically conductively contacted with the printed circuit board, the basic body is designed as a hollow part, in which for making electrical contact with the printed circuit board a screw is so screwed that by the screw the first section is expandable radially outward.

The invention proposes a completely new electricity bolt for making electrical contact of a printed circuit board with an electric conductor. At least in the area of the first section, by which the electricity bolt is electrically conductively connectable to the printed circuit board, the basic body of the electricity bolt is designed as a hollow part. For the purpose of electrically contacting the electricity bolt with the printed circuit board, a screw can be screwed into this section, namely in such a way that the first section is expanded by the screw radially outwardly. In non-expanded state of the first section of the basic body of the electricity bolt, the electricity bolt can be inserted with the first section with a clearance into a recess of the printed circuit board, without the risk that chips are scraped from the printed circuit board. In this state of being inserted into the recess of the electricity bolt, a screw can then be screwed into the first section of the basic body, which pushes the first section of the basic body of the electricity bolt radially outward and thereby is electrically conductively contacted with the printed circuit board. A soldering of the electricity bolt to the printed circuit board is not required.

According to an advantageous further development, the basic body has in the region of the first section at least one longitudinally extending slot. Preferably, the basic body is divided into several segments in the peripheral area of the first section by a plurality of longitudinally extending slots, wherein the circumferential segments can be pressed by the screw radially outward. Then, when the basic body is slotted in the region of its first section, the basic body can particularly advantageously be radially pushed outward or radially expanded by the screw for fixing it to the printed circuit board and for making electrical contact with the printed circuit board.

According to an advantageous development, the basic body comprises in the region of the first section a recess, which limits the insertion depth of the first section of the basic body in a recess of the printed circuit board, wherein the or each slot extends in the longitudinal direction of the basic body on both sides of the recess. On the one hand, an exact positioning of the electricity bolt with respect to the printed circuit board is possible, on the other hand, the electricity bolt can be particularly advantageously electrically conductively contacted with the printed circuit board.

According to an advantageous development, an internal thread is formed on the basic body in the region of the first section, said screw, which serves the radial expansion of the first section of the basic body, can be screwed into the inner thread and is preferably formed as a tapered screw. This allows a particularly advantageous electrically conductive contact of the electricity bolt with the printed circuit board. This screw can be screwed into the first section or the second section of the basic body.

According to an advantageous further development, the basic body in the area of the second section, through which it is electrically contactable with the electric conductor, can also be designed as a hollow part, into which another screw can be screwed for electrical contact with the electric conductor in such a manner that the electric conductor can be clamped between the second section and the further screw, namely a screw head thereof. This allows a simple and reliable electrically conductive contact of the electric conductor with the electricity bolt on the second section of the basic body of the electricity bolt.

BRIEF DESCRIPTION OF THE DRAWINGS

Preferred developments result from the dependent claims and the following description. Embodiments of the invention are explained in greater detail using the drawing, without being limited thereto. The figures show:

DETAILED DESCRIPTION OF THE DRAWINGS AND PRESENTLY PREFERRED EMBODIMENTS

The present invention concerns an electricity bolt for electrically contacting a printed circuit board with an electric conductor.

Figure 2:
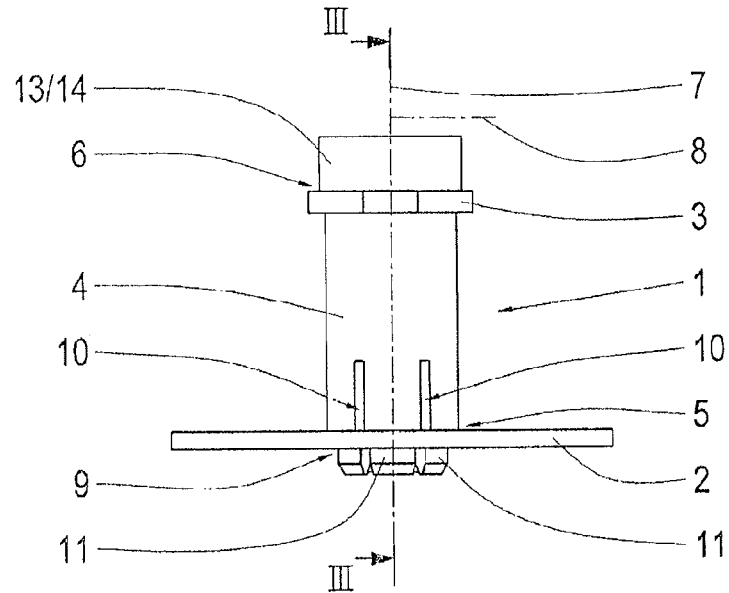
FIG. 2 shows the electricity bolt of FIG. 1 together with a printed circuit board and an electric conductor.

An electricity bolt 1 for electrically contacting a printed circuit board 2 with an electric conductor 3, for example, a busbar, has a basic body 4. The basic body 4 has a first section 5 for contacting the electricity bolt 1 with the printed circuit board 2, and a second, opposite section 6 for electrically contacting the electricity bolt 1 with the electric conductor 3. The basic body 4 of the electricity bolt 1 has a cylindrical outer wall shown in the embodiment, and in FIG. 2 is visualized a longitudinal direction 7 and a radial direction 8 of the basic body 4 of the electricity bolt 1.

According to the invention, the electricity bolt, namely its basic body 4, at least in the area of the first section 5 by which the electricity bolt 1 can be electrically contacted with the printed circuit board 2, is designed as a hollow part. A screw 12 is screwed into this first section 5 for electrically contacting the printed circuit board 2 with the electricity bolt 1. The screw is screwed in such a way that the first section 5 of the basic body 4 of the electricity bolt 1 is radially outwardly expandable or pressed radially outward by the screw 12 in order to securely fix the first section 5 of the electricity bolt 1 in a recess of the printed circuit board 2 and, in addition, securely electrically conductively contact it with a trace of the electrical printed circuit board 2.

In non-expanded state of the first section 5 of the basic body 4 of the electricity bolt 1, the electricity bolt 1 can be inserted by the first section 5 with a clearance into a recess of the printed circuit board 2. In non-expanded state of the first section 5 of the basic body 4, an outer diameter of the first section 5 of the basic body 4 is therefore smaller than an inner diameter of the recess of the printed circuit board 2. The outer diameter of the first section 5 of the basic body 4 is expandable by the screw 12 cooperating with the first section 5 of the basic body 4, preferably when the electricity bolt 1 is inserted with its first section 5 into the recess of the printed circuit board 2. As a result, the clearance between the first section 5 of the basic body 4 of the electricity bolt 1 and the printed circuit board 2 is hereby eliminated.

In the illustrated preferred embodiment of the invention, the electricity bolt comprises in the area of the first section 5, by which it is to be electrically conductively contacted with the printed circuit board 2, a recess 9. The recess 9 in the area of the first section 5 of the basic body 4 is used as a stop and defines the insertion depth of the first section 5 of the basic body 4 in a recess of the printed circuit board 2.

Furthermore, the basic body 4 of the electricity bolt 1 in the shown preferred embodiment comprises in the region of the first section 5 at least one, preferably several, slots 10 extending in the longitudinal direction 7 so that the basic body 4 is in the region of the first section 5 divided by a plurality of longitudinally extending slots 10 into a plurality of circumferential segments 11. Seen in the longitudinal direction 7 of the basic body 4, the slots 10 extend on both sides of the recess 9.

Then, when the electricity bolt 1 is to be positioned with its first portion 5 in a recess of the printed circuit board 2, the electricity bolt 1 is positioned with its first portion 5, which is not yet expanded or pressed radially outwardly, in the recess of the printed circuit board 2 with a slight clearance between the recess of the printed circuit board 2 and the first section 5 of the basic body 4 of the electricity bolt 1.

The recess 9 limits the insertion depth of the first section 5 of the basic body 4 of the electricity bolt 1 in the recess of the printed circuit board 2.

Once the electricity bolt 1 is positioned in this fashion with its first section 5 in the recess of the printed circuit board 2, the first section 5 is radially outwardly expanded by the screw 12, namely so that the screw 12, which in the shown preferred embodiment is designed as a conical screw, is screwed into an inner thread of the first section 5 formed in the first section 5 of the basic body 4.

Figure 1:
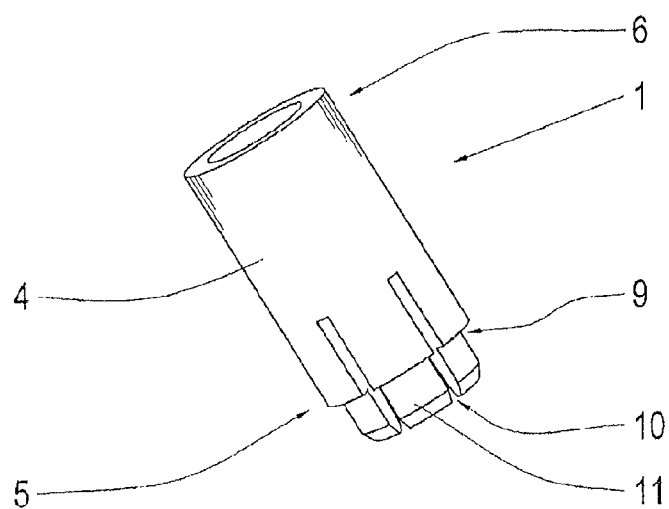
FIG. 1 shows a perspective view of an electricity bolt for electrically contacting a printed circuit board with an electric conductor.
Figure 3:
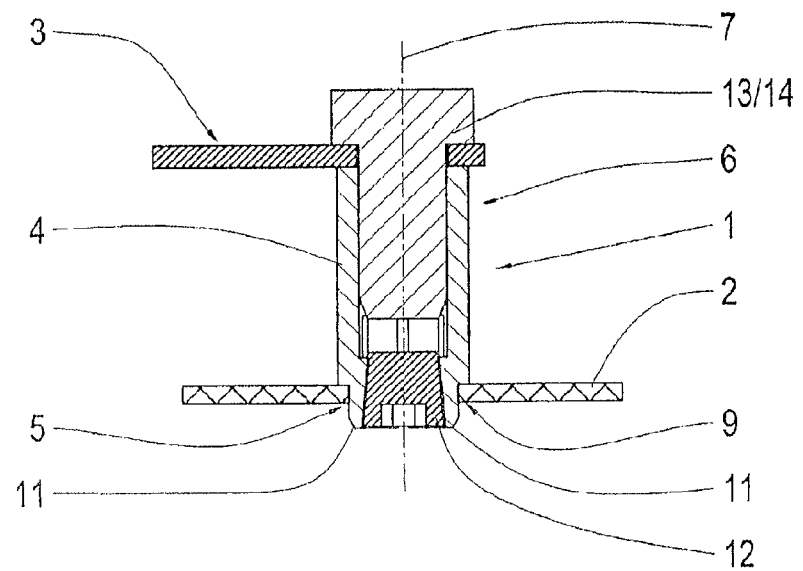
FIG. 3 shows the cross section of FIG. 2.

The longitudinally extending slots 10 favor the simple radial expansion of electricity bolt 1 in the region of its first section 5, by which on the one hand the electricity bolt 1 is securely fixed by its first section 5 in the recess of the printed circuit board 2 and, on the other hand, a reliable electrical contact of the first section 5 of the electricity bolt 1 with the printed circuit board 2 is ensured. In the embodiment of FIGS. 1 to 3, the screw, which is designed as a tapered screw, is screwed into the first section 5 of the basic body 4.

Figure 4:
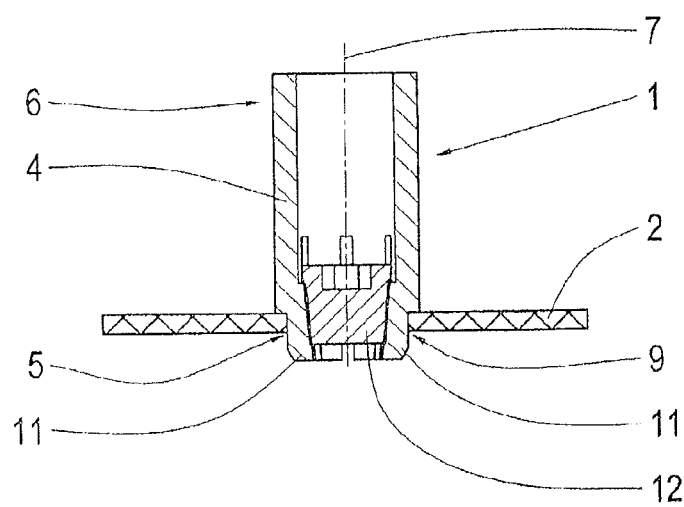
FIG. 4 shows a cross section through an alternative electricity bolt.

In contrast, it is also possible, as shown in FIG. 4, that the screw 12 is screwed into the second section 6 of the basic body 4 in order to radially expand the basic body 4 of the electricity bolt 1 in the region of its first section 5 by the conical screw 12. Then, as shown in the embodiment of FIG. 4, when the screw 12 is screwed from the second section 6 of the basic body 4 into the first section 5 of the basic body 4, the basic body 4 must be designed over its entire longitudinal extension 7 as a hollow component. In this case, the basic body 4 is formed in a tubular shape.

As already stated, the second section 6 of the basic body 4 of the electricity bolt 1 can be electrically conductively contacted with an electric conductor 3 which is designed, for example, as a busbar.

To this end, in the illustrated embodiment the basic body 4 is carried out also in the area of the second section 6 as a hollow component. In this second section 6, a further screw 13 can be screwed in so as to electrically connect the electric conductor 3 to the second section 6 of the basic body 4 of the electricity bolt 1, wherein the electric conductor 3 is clamped between the second section 6 of the basic body 4 of the electricity bolt 1 and a screw head 14 of the other screw 13 and thus is electrically conductively contacted with the electricity bolt 1.

In the illustrated preferred embodiment of the FIGS. 1 to 3, the electricity bolt 1 is positioned with its first section 5 with a slight play in a recess or borehole of a printed circuit board 2. A recess 9 formed on the first section 5 limits the insertion depth of the first section 5 of the electricity bolt 1 in the printed circuit board recess or the printed circuit board borehole. On both sides of this recess 9, the basic body 4 of the electricity bolt 1 in the region of its first portion 5 is divided by slots 10 extending in the longitudinal direction 7 into several peripheral segments 11. Further, the first section 5 of the basic body 4 has an internal tapered thread. By screwing in the first screw 12 embodied as a tapered bolt, the first section 5 of the basic body 4 of the electricity bolt 1 is expanded radially outward, in which case then the electricity bolt 1 is fixed with its first section 5 in the printed circuit board recess or printed circuit board borehole and is electrically conductively contacted with the printed circuit board 2. The introduction of the first screw 12, preferably formed as a conical screw, can be carried out into the first section 5 of the basic body 4 of the electricity bolt 1 starting from the first portion 5, i.e. from below as shown in FIGS. 2 and 3, or starting from the opposite section 6, i.e. from above as shown in FIG. 4. The screwing of the screw 12 with the first section 5 of the basic body 4 of the electricity bolt 1, starting from the first section 5, i.e. from below as shown in FIGS. 2 and 3, is preferred, because in this case the electric conductor 3 can be in advance connected and electrically conductively contacted to the electricity bolt 1 by another screw 13.

REFERENCE NUMERALS

1 Electricity bolt
2 Printed circuit board
3 Electric conductor
4 Basic body
5 First section
6 Second section
7 Longitudinal direction
8 Radial direction
9 Recess
10 Slot
11 Circumferential segment
12 Screw/tapered screw
13 Further screw
14 Screw head

The invention claimed is:

1. An electricity bolt for electrical contact of a printed circuit board with an electric conductor, the electricity bolt comprising:
a basic body comprising a first section and a second section, the first section in electrical contact with the printed circuit board and the second section in electrical contact with the electric conductor;
wherein the first section of the basic body comprises a hollow component, wherein a screw is positioned in the hollow component to radially outwardly widen the first section of the basic body; and
wherein the first section comprises an internal thread in the basic body, wherein the screw which is used for the radial expansion of the first section of the basic body can be screwed into the internal thread.

2. The electricity bolt of claim 1, wherein the screw starting from the second section of the basic body can be screwed into the same.

3. The electricity bolt of claim 1, wherein the screw which is used for the radial expansion of the first section of the basic body is designed as a tapered screw.

4. The electricity bolt of claim 1, wherein the basic body in the area of the second section, by which the basic body is electrically contactable with the electric conductor, is designed as a hollow part, in which a further screw can be screwed in such a manner that the electric conductor can be clamped between the second section and the further bolt.

5. The electricity bolt of claim 1, wherein the basic body is carried out entirely as a hollow part seen in the longitudinal direction.

6. The electricity bolt of claim 1, wherein the first section of the basic body comprises at least one slot extending in longitudinal direction.

7. The electricity bolt of claim 6, wherein the basic body has a recess in the area of the first section, which limits the insertion depth of the first section of the basic body into a recess of the printed circuit board, wherein the slot extends on both sides of the recess seen in the longitudinal direction of the basic body.

8. The electricity bolt of claim 6, wherein the first section comprises an internal thread in the basic body, and wherein the screw which is used for the radial expansion of the first section of the basic body can be screwed into the internal thread.

9. The electricity bolt of claim 6, wherein the screw starting from the second section of the basic body can be screwed into the same.

10. The electricity bolt of claim 6, wherein the screw which is used for the radial expansion of the first section of the basic body is designed as a tapered screw.

11. The electricity bolt of claim 6, wherein the basic body in the area of the second section, by which the basic body is electrically contactable with the electric conductor, is designed as a hollow part, in which a further screw can be screwed in such a manner that the electric conductor can be clamped between the second section and the further bolt.

12. The electricity bolt of claim 6, wherein the basic body is carried out entirely as a hollow part seen in the longitudinal direction.

13. The electricity bolt of claim 6, wherein the first section of the basic body comprises a plurality of longitudinally extending slots that divide the first section into a plurality of circumferential segments, when the circumferential segments can be pressed radially outward by the screw.

14. The electricity bolt of claim 13, wherein the basic body has a recess in the area of the first section, which limits the insertion depth of the first section of the basic body into a recess of the printed circuit board, wherein each slot extends on both sides of the recess seen in the longitudinal direction of the basic body.

15. The electricity bolt of claim 13, wherein the first section comprises an internal thread in the basic body, and wherein the screw which is used for the radial expansion of the first section of the basic body can be screwed into the internal thread.

16. The electricity bolt of claim 13, wherein the basic body in the area of the second section, by which the basic body is electrically contactable with the electric conductor, is designed as a hollow part, in which a further screw can be screwed in such a manner that the electric conductor can be clamped between the second section and the further bolt.

17. The electricity bolt of claim 13, wherein the basic body is carried out entirely as a hollow part seen in the longitudinal direction.

18. The electricity bolt of claim 1, wherein the screw starting from the first section of the basic body can be screwed into the same.

19. The electricity bolt of claim 18, wherein the screw which is used for the radial expansion of the first section of the basic body is designed as a tapered screw.

* * * * *